United States Patent [19]

Nelson

[11] 3,934,335
[45] Jan. 27, 1976

[54] MULTILAYER PRINTED CIRCUIT BOARD
[75] Inventor: Mark A. Nelson, Dallas, Tex.
[73] Assignee: Texas Instruments Incorporated, Dallas, Tex.
[22] Filed: Oct. 16, 1974
[21] Appl. No.: 515,282

[52] U.S. Cl. .................. 29/625; 96/36.2; 174/68.5; 317/101 B; 427/96
[51] Int. Cl.² ...................... H05K 3/18; H05K 3/28
[58] Field of Search .............. 29/625; 96/36.2, 38.4; 174/68.5; 117/212, 213, 215, 217, 5.5, 6, 8.5, 66, 67; 317/101 A, 101 B

[56] References Cited
UNITED STATES PATENTS

| | | | |
|---|---|---|---|
| 3,366,519 | 1/1968 | Pritchard et al. | 156/3 |
| 3,525,617 | 8/1970 | Bingham | 156/3 X |
| 3,540,954 | 11/1970 | Pritchard et al. | 156/3 |
| 3,622,384 | 11/1971 | Davey et al. | 317/101 A X |
| 3,628,999 | 12/1971 | Schneble et al. | 317/101 B X |
| 3,666,549 | 5/1972 | Rhodenizer et al. | 96/36.2 X |
| 3,679,941 | 7/1972 | Lacombe et al. | 317/101 A |
| 3,698,940 | 10/1972 | Mersereau et al. | 117/212 |
| 3,745,095 | 7/1973 | Chadwick et al. | 174/68.5 UX |
| 3,846,166 | 11/1974 | Saiki et al. | 174/68.5 X |

Primary Examiner—C. W. Lanham
Assistant Examiner—Joseph A. Walkowski
Attorney, Agent, or Firm—Harold Levine; Rene E. Grossman; Alva H. Bandy

[57] ABSTRACT

Multilayer printed circuit board is fabricated by coating a suitable substrate, metal, plastic, paper, with a photosensitive coating, exposing the photosensitive coating to form a dielectric thereof, coating the dielectric layer with a coating of a photosensitive chemical solution, selectively imaging and developing the photosensitive coating to form a desired circuit pattern on the dielectric coating, forming a first layer of circuitry by coating the circuit pattern with a conducting material, coating the circuitry bearing layer with a second layer of photosensitive material, selectively exposing and developing the second layer of photosensitive material to form a dielectric with open windows to the first circuit layer, coating the second dielectric layer of the first circuitry with a coating of photosensitive chemical solution, selectively imaging and developing the coating of photosensitive chemical solution to form a circuit pattern and an interconnect pattern and forming a conductor layer of circuitry and interconnects, the interconnect metallization connecting the second circuitry layer with the first circuitry layer, repeating the process to form additional circuitry layers to perform a desired electrical function and forming on the last dielectric layer a metallization such as either a solder mask for circuit terminals or a ground plane and thereafter either retaining the substrate if desired for, for example, a heat sink or additional support or both, or removing the substrate to form a very light weight multilayer printed circuit board.

11 Claims, 10 Drawing Figures

MULTILAYER PRINTED CIRCUIT BOARD

This invention relates to printed circuit boards and more particularly to an additive process for fabricating a multilayer printed circuit board.

In the past, multilayer printed circuit boards were fabricated from individual layers of substrates consisting of an epoxy base fiberglass weave or other types of plastic with copper on either or both sides. The external surfaces of individual boards were then negatively or positively imaged with a plating resist and a protective tin or tin lead plating added as an etch resist. The plating resist was then removed from the surface and the exposed copper surfaces etched away leaving the desired circuitry and interconnections. This process has become known as the subtractive process. To form the multilayer circuit board, a specific group of individual layers of substrates, bearing selected circuits, were laminated together to produce the desired circuit build-up. A circuit hole pattern for electrically connecting circuits of the multilayer printed circuit board was drilled through the laminating substrates. The circuit holes were plated through with copper to affect layer interconnections.

Several problems attend the prior art multilayer circuit boards. For example, it is difficult to align the multilayer circuit boards so that the interconnection holes provide contact between the layers. Also, the hole drilling process creates epoxy smears which isolate the internal circuits from electrical connecting during thru hole plating. Further, many additional tolerance problems are encountered during the fabrication.

The first problem, often referred to as layer to layer misregistration, is the result of: substrate instability, which results from the moisture content and the different amounts of copper forming the circuit patterns deposited on the substrates; and thermal coefficient of expansion differences of the materials utilized in the printed circuit boards which result in uneven layer expansion.

The epoxy smearing problem arises when the circuit hole pattern is drilled. The drills push or smear the insulating epoxy over the circuit copper interconnects which unless removed prior to hole plating very effectively insulates the copper conductor interconnects.

The tolerance problems result from the subtractive process used to form the conductor patterns; that is, such substrate reacts in a particular manner when varying amounts of copper are removed from the surfaces and when exposed to the wet processing requirements of etching and cleaning. Also, the lamination cycle induces additional tolerance differentials due to thermal mismatch from layer to layer, that is, the thermal gradient through the layers and the resulting addresses contributes to the misalignment of the individual layers.

To alleviate the above-mentioned problems, the laminated structures have been baked to improve stability, but this baking contributes to the thermal mismatch of the layers. To reduce thermal mismatch, special pin fixtures have been used to maintain layer to layer registration. In some processes the laminated board has been x-rayed and circuit holes are off-set drilled to avoid electrical short circuits and opens due to misregistered layers. Off-set drilling is not particularly desirable and is precluded if the circuit components are to be installed by automatic insertion equipment as the use of automatic insertion equipment requires a highly controlled hole location. From the foregoing discussion of the prior art, it is self-evident that the multilayer printed circuit boards are of questionable reliability and expensive to fabricate.

Further, multilayer boards are being produced by an additive process disclosed in U.S. Pat. application, Ser. No. 461,072, filed Apr. 15, 1974 in which positive screening techniques are used to form the conductor pattern. The problem attending positive screening techniques is that fine line conductors with high resolution cannot be produced.

Accordingly, it is an object of this invention to provide a reliable multilayered printed wiring or circuit board which is both economical to manufacture and susceptible to fabrication using mass production techniques.

Another object of the invention is to provide a multilayer printed circuit board whose thickness and weight is substantially less than that of a multilayer printed circuit board.

Yet another object of the invention is to provide a multilayer printed circuit board having a single substrate core with multilayers.

Still another object of the invention is to provide a multilayer printed circuit board without the single substrate core.

Still yet another object of the invention is to provide a process for the fabrication of multilayer boards which eliminates drilled holes for layer to layer interconnections and which is substantially free of tolerance requirements.

A further object of the invention is to produce a multilayer printed circuit board having fine line conductor patterns of high resolution.

Briefly stated this invention is for a multilayer printed circuit board and an additive method of fabrication utilizing a photosensitive substrate material as an insulator or dielectric and a photosensitive chemical process for conductor pattern formation. The multilayer printed circuit board comprises a substrate core which may be, for example, of metal, plastic, or paper of which either major surface or both major surfaces can be used for the multilayers. If both major surfaces are used, a desired conductor feed through hole pattern is formed in the substrate by piercing or drilling. Either or both major surfaces of the substrate are coated with photosensitive substrate material which is exposed to a polymerizing light source to form a dielectric or insulating coating for the substrate and, if both major substrate surfaces are used, a hole feed through pattern. A photosensitive chemical solution is then applied to the dielectric coating of a major substrate surface. A mask for the desired circuit pattern and hole pattern, if included, is placed over the photosensitive chemical solution layer and exposed to form an insoluble pattern for the desired circuit and hole pattern. The exposed area is then prepared for the desired circuit pattern by adding an adhesive material to the circuit and hole conducting patterns. The conductor for the circuit and feed through holes are electrolessly plated thereon. If both major surfaces are to be used, a second circuit layer is formed, as above described, on the second major surface with the circuits electrically connected by the conductor formed in the feed through hole pattern. Each additional layer is formed by coating a circuit bearing layer with a layer of photosensitive substrate material; the layer of substrate material is masked with a circuit interconnect pattern and exposed with a polymerizing light to selectively form a dielectric layer having circuit interconnects or open windows formed thereon. The dielectric is conditioned and coated with a photosensitive chemical solution layer, masked with appropriate artwork of a desired circuit pattern and exposed to form a circuit pattern on the insulating layer. The circuit pattern is coated with an adhesive and electrolessly plated with a conducting metal to form the conducting circuit pattern. The procedure is then repeated on either or both major surfaces to form as many circuit layers as is required to perform a certain electrical function. A final layer of photosensitive substrate material is then imaged and developed to form a ground plane or terminal pads as desired. If the circuit layers have been formed all on one of the major surfaces of the substrate, the substrate may be removed to form a multilayer printed wiring board of minimal thickness. Nevertheless, if it is desired to retain the substrate for, for example, a heat sink, or for rigidity, both major surfaces of the substrate may be plated with the substrate hole pattern being metallized through the holes to form the desired circuit feed through interconnections.

The novel features of the invention are pointed out with particularity in the appended claims. However, the invention itself, together with further objects and advantages thereof, may best be understood by reference to the following description taken in conjunction with the accompanying drawings in which:

Figure 1:
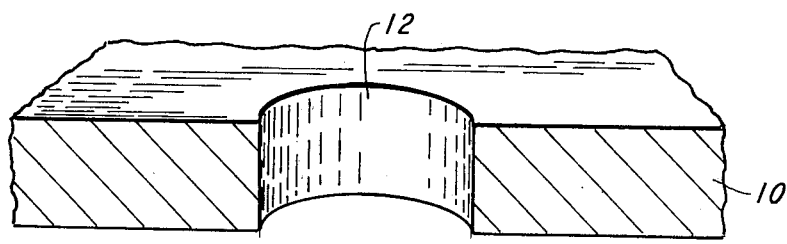
FIG. 1 is a partial cross-sectional view of a metal substrate having an aperture or a hole pattern punched therein.

Referring to the drawings, the substrate 10 (FIG. 1) which may be, for example, a metal, plastic or paper substrate, which if it is to be plated on both sides has apertures or holes 12 of a hole pattern for desired electrical circuits punched, drilled or otherwise formed therein. The holes 12 of the substrate hole pattern have a diameter sufficient to accomodate the number of interconnections required to connect related circuits to be formed on the multilayers on each side of the metal substrate. The holes should have a diameter of a size sufficient to accomodate about a 5 mil layer interconnect required for electrically coupling the first layer formed on one major surface of the substrate to the first layer formed on the other major surface and one mil for each additional interconnect formed in the lead through holes 12.

The substrate is prepared for multilayer fabrication on both major surfaces by cleaning, for example, for a metal (low carbon steel) substrate cleaning is as follows: after the hole pattern is punched on the substrate 10, the substrate is degreased with suitable degreasing materials such as, for example, trichloroethylene, and then passed through a rust removal chemical which may be a hydrochloric acid solution. The acid solution is rinsed off and the substrate passed through an alkaline solution such as that sold under the trademark of Oakite 190, after which it is rinsed again and passed through a zinc-phosphide solution such as that sold under the trademark Phosdip R2. The cleaning is repeated by passing the substrate 10 through a second degreaser.

Figure 2:
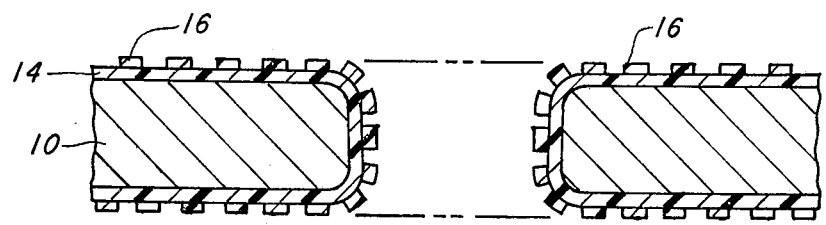
FIG. 2 is a partial cross-sectional view of the metal substrate of FIG. 1 with an exposed photosensitive substrate coating forming a dielectric thereon; the dielectric is shown greatly enlarged to show its surface conditioned to receive the photosensitive chemical solution coating.

After thorough cleaning, the substrate 10 is coated with a layer of a photosensitive substrate material 14 (FIG. 2), such as, for example, the diazonium compound mixed with a solvent and an epoxy monomer disclosed in U.S. Pat. No. 3,708,296, issued Jan. 2, 1973. After evaporating the solvent from the photosensitive epoxy, the epoxy is exposed to ultraviolet light. When the ultraviolet light strikes the epoxy, the diazonium compound decomposes to yield a catalyst in the form of a Lewis acid which initiates the polymerization of the epoxy monomer. The resulting polymer is resistive to most solvents and chemicals. The exposed photosensitive epoxy or polymer 14 forms a dielectric coat about 1 to 5 mils thick which insulates the substrate 10 from the electrical circuitry of the printed wiring board multilayers.

Multilayers are then formed on each major surface coated with the photosensitive substrate dielectric 14. A suitable additive technique that eliminates etching and lamination is used. Such a technique is, for example, as follows: first, the dielectric coated substrate 14 (FIG. 2) is immersed for about 10 minutes in a 10-normal basic solution such as sodium hydroxide at 25°C to form a layer 16 of high density invisible islands approximately 5 nm in diameter and separated by 10 nm over the major substrate surfaces and hole surfaces of the feed through hole pattern. The exposed substrate is rinsed and one major surface sensitized by, for example, immersion for one minute in a sensitizing solution such as, a tin chloride solution. A suitable tin solution is 25 grams $SnCl_2 \cdot 2 H_2O + 40$ nl . HCl + 1 liter $H_2O$.

The tin, in the form of a hydrate, conditions the dielectric surface by forming a layer 18 (FIG. 3) on the high density invisible islands 16. The substrate is then immersed in deionized water to remove excess tin and dried by any suitable method such as, for example, flowing nitrogen, sponging, squeegeeing, or blotting. Improper water treatment causes the tin hydrate to vary in density on the surfaces and this is seen as "streaking" during subsequent electroless plating when the metal begins to deposit. The tin chloride sensitizing solution is believed to be a suspension of colloidal particles based on $Sn^{4+}$, with $Sn^{2+}$ rich outer layers, in a bath of both complex and uncomplexed $Sn^{2+}$ ions.

Figure 3:
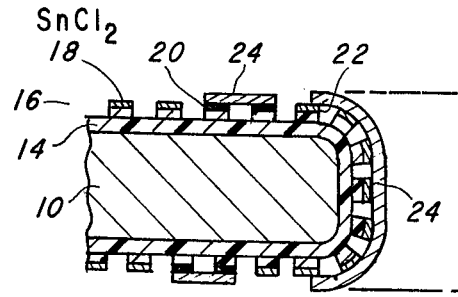
FIG. 3 is a partial cross-sectional view of the metal substrate of FIG. 2 having an exposed photosensitive area defining a negative working area of a circuit pattern coated with an adhesive coating.

The conductor pattern 20 (FIG. 3) and the metallized feed through hole pattern 22 can be formed by projecting an image onto the stannous chloride if a columnated ultraviolet light source is used, or by using a contact mask of the desired conductor pattern in near or intimate contact with the substrate and exposing with either a heat source or ultraviolet source. For high resolution of the conductor lines, a contact mask for negative artwork is preferred. Thus, in the preferred method, the unmasked sensitized surface or circuit pattern and feed through holes of the substrate are exposed by an ultraviolet light source. The useful photon wavelengths for promoting tin oxidation are found to range from 200 to 400 nm with 200 nm photons being about 10 times more effective than 300 nm photons, and 100 times more effective than 400 nm photons. A suitable ultraviolet light source is Xenon flash lamp operated at high current densities. The tin chloride solution being a negative working solution, that is, the exposed area will not wash off and will receive metal conductors, it acts as a catalyst for metal deposition. To eliminate peeling and to obtain maximum adhesion and brightness of the conductor pattern, the exposed area of the substrate of conductor pattern is activated by immersion in a non-critical palladium-hydrochloric acid solution containing about 1.25g $PdCl_2$ (99%) + 10 nl in 1 liter of $H_2O$ for about ½ to 1 minute and then rinsed in a deionized water rinse for about 1 minute. The small amount of hydrochloric acid used forms a complex tetrachloride ion $(PdCl_4)^{2-}$. The rinse step removes palladium solution and any loose metal, either of which can cause catastrophic electroless plating bath failure. The $Sn^{2+}$ regions on the substrate surface act to galvanically reduce palladious ions to the metal covering the active sensitizer sites with ultra thin discontinuous palladium deposits 24 (FIG. 3). The process is then repeated for the second major surface.

Figure 4:
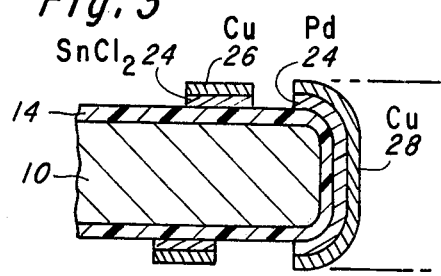
FIG. 4 is the partial cross-sectional view of the metal substrate of FIG. 3 having the structural details of the surface layers omitted to show more clearly the photosensitive epoxy resist layer imaged, developed, and with the adhesive forming the desired circuit pattern and feed through conductors thereon.

The substrate, with the precoating layers shown as continuous layers in FIG. 4, i.e., as seen by the eye, is then plated with a suitable conductor material such as copper to form the conducting patterns 26 (FIG. 4) and feed through conductors 28. Preferably the conducting patterns and feed through holes are copper patterns which have been electrolessly plated from a suitable solution such as one of those described in U.S. Pat. No. 3,095,309 issued June 25, 1963.

Figure 5:
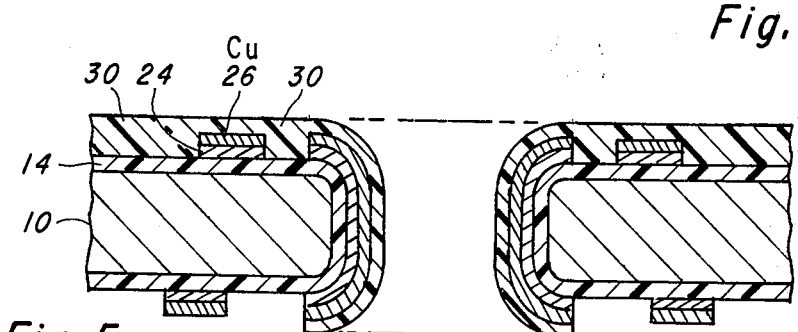
FIG. 5 is a partial cross-sectional view of the substrate of FIG. 4 having the electrical conductor pattern and feed through hole conductors formed thereon.
Figure 6:
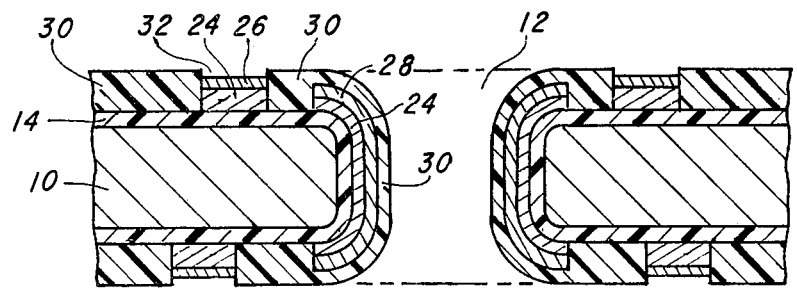
FIG. 6 is a partial cross-sectional view of the metal substrate of FIG. 5 having added thereto a dielectric coating having a circuit interconnect window formed therein.

Next, the dielectric area and copper plated conducting circuit pattern of the first major substrate surface together with the conductors of the feed through hole pattern are coated with a photosensitive substrate material (FIG. 5). The substrate material is masked against exposure of areas for open interconnect windows 32 (FIG. 6) for electrically connecting the circuit of the next layer to a circuit of the first layer, and exposed with a polymerizing light source, such as for example, heat or ultraviolet light, to form a dielectric layer 30 (FIG. 6). The masked or unexposed epoxy is washed away to form the open interconnect windows 32. A suitable photosensitive epoxy is that manufactured by American Company described in the previously mentioned U.S. Pat. No. 3,788,296. The second major surface of the first layer is then selectively coated with a dielectric using the same technique.

Figure 7:
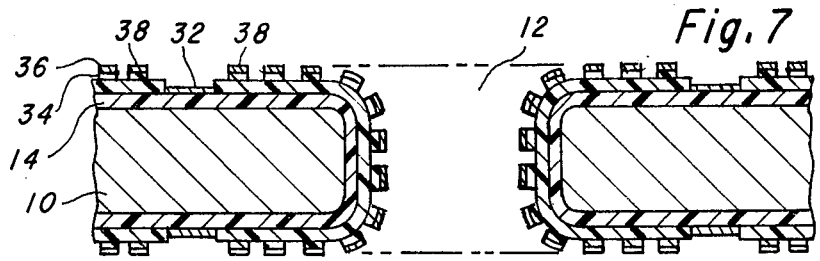
FIG. 7 is a partial cross-sectional view of the metal substrate of FIG. 6 having another photosensitive substrate coating imaged, developed and selectively coated with an adhesive to form a dielectric layer with a circuit pattern leading to the circuit interconnect windows formed in the dielectric layer.
Figure 8:
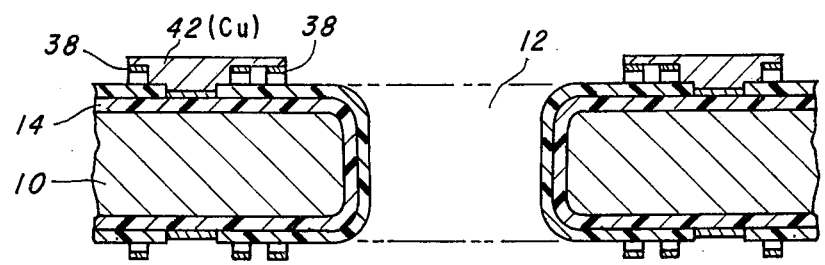
FIG. 8 is a partial cross-sectional view of the metal substrate of FIG. 6 having selectively patterned thereon the circuit of the second layer and circuit interconnects of the multilayer circuits.

With the dielectric selectively imaged onto the circuit layers of the first and second major surfaces of the substrate the first layer of the multilayer printed circuit board is complete. Additional layers are formed by repeating the process from the dielectric conditioning step with the base (NaOH) solution to form the invisible layer of islands 34 (FIG. 7) as follows. After forming the layer of islands on the first and second major substrate surfaces, the islands 34 of the first major substrate surface are sensitized by immersion in the photosensitive chemical solution to form the sensitization layer 36. The sensitized layer 36 is then masked with a mask permitting exposure to harden the circuit pattern areas. The unexposed area of the sensitized layer is washed away. The process is then repeated for the second major substrate surface. The substrate is then immersed in the adhesive solution (palladium-hydrochloric acid) to coat the circuit conductor patterns with an adhesive 38. A suitable conductor material such as copper is then electrolessly plated on the circuit patterns and open window circuit interconnects 32 to form the electrical conductor patterns 42 and multilayer circuit interconnections (FIG. 8).

Figure 9:
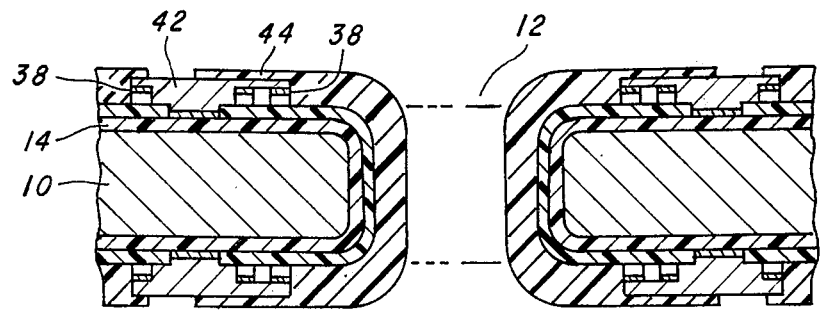
FIG. 9 is a partial cross-sectional view of the metal substrate of FIG. 8 showing the addition of the solder mask formed thereon.
Figure 10:
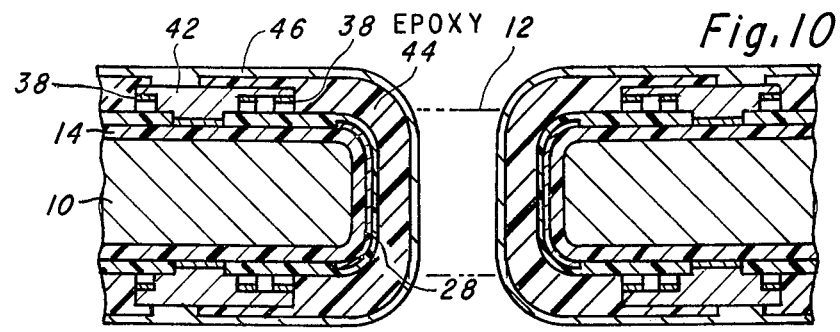
FIG. 10 is a partial cross-sectional view of FIG. 9 showing the addition of the solder mask protective coat.

After fabricating the desired number of multilayers, a solder mask 44 (FIG. 9) is formed thereon preferably by photoimaging. However, a suitable screenable solder mask is an epoxy such as, Photocircuits PC 401 which is screened on to cover all areas not to be soldered. The solder mask layer 44 is then cured and coated with a rosin protective coating 46 (FIG. 10) to prevent oxidation of the soldering pads prior to interconnection of the multilayer printed circuit board into an electrical system. It will be understood that the final metallization may be a ground plane for the circuit system.

In other embodiments of the multilayer printed circuit board, the substrate feed through hole pattern is eliminated and the multilayered printed circuit board is fabricated on one side of the substrate in accordance with the above-described fabrication process and removed from the substrate to form a flexible multilayer printed circuit board which can be mounted, for example, on the housing of the circuit product. Such a product is a calculator. Applicant has found that in using the described process the multilayers can be removed from the substrate within twenty-four hours without damage.

It will be apparent to a person skilled in the art that the other embodiments and various modifications to the details of fabrication shown and described may be made without departing from the scope of this invention.

What is claimed is:

1. A method for fabricating a multilayer printed wiring circuit board comprising:
   a. forming a dielectric layer on a substrate;
   b. coating the dielectric layer with a first layer of photosensitive material;
   c. selectively exposing the first layer of photosensitive material to form a layer defining a first conductor pattern of exposed photosensitive material;
d. forming the conductor pattern with a conductor material to form conductors in the conductor pattern;
e. coating the circuit bearing layer with a layer of photosensitive substrate material;
f. selectively exposing the layer of photosensitive substrate material to form a second dielectric layer defining circuit layer interconnections;
g. coating the second dielectric layer with a second layer of photosensitive material;
h. selectively exposing the second layer of photosensitive material to form a layer defining a second circuit pattern of exposed photosensitive material;
i. forming the second conductor pattern with electrically conducting material; and
j. repeating steps e through i to form a plurality of electrically interconnected layers of circuitry.

2. A method according to claim 1 further comprising forming apertures of a feed through hole pattern in the substrate prior to forming the dielectric layer on the substrate and coating the holes of the hole pattern with a dielectric layer.

3. A method according to claim 1 wherein the coatings of photosensitive substrate material are exposed by heat.

4. A method according to claim 1 wherein the coatings of photosensitive substrate material are exposed by ultraviolet light.

5. A method according to claim 1 further comprising removing the core substrate from the first dielectric layer.

6. A method according to claim 2 comprising forming the multilayer circuits on the major substrate surfaces.

7. A method according to claim 1 further comprising forming a ground plane on the dielectric layer covering the substrate.

8. A method according to claim 1 further comprising forming a metallization on the last circuit layer.

9. A method according to claim 8 wherein the desired metallization pattern is a ground plane.

10. A method according to claim 1 further comprising forming a solder mask over the outer circuit layer.

11. A method according to claim 10 wherein the soldering mask comprises selectively coating the outer circuit layer with an epoxy to define areas to be soldered, curing the epoxy layer; and coating the epoxy layer with a protective coating to prevent oxidation of the solder areas.

* * * * *